US009857395B2

(12) United States Patent
Wang et al.

(10) Patent No.: US 9,857,395 B2
(45) Date of Patent: Jan. 2, 2018

(54) METHOD AND APPARATUS FOR MEASURING AVERAGE INDUCTOR CURRENT DELIVERED TO A LOAD

(71) Applicant: STMicroelectronics (Shenzhen) R&D Co. Ltd, Shenzhen (CN)

(72) Inventors: Meng Wang, Shenzhen (CN); Xue Lian Zhou, Shenzhen (CN)

(73) Assignee: STMicroelectronics (Shenzhen) R&D Co. Ltd, Shenzhen (CN)

( * ) Notice: Subject to any disclaimer, the term of this patent is extended or adjusted under 35 U.S.C. 154(b) by 125 days.

(21) Appl. No.: 14/955,207

(22) Filed: Dec. 1, 2015

(65) Prior Publication Data

US 2017/0146571 A1    May 25, 2017

(30) Foreign Application Priority Data

Nov. 23, 2015  (CN) .......................... 2015 1 0818237

(51) Int. Cl.
*G01R 15/18* (2006.01)
*G01R 15/16* (2006.01)
*G01R 19/165* (2006.01)

(52) U.S. Cl.
CPC ............ *G01R 15/18* (2013.01); *G01R 15/16* (2013.01); *G01R 19/16538* (2013.01)

(58) Field of Classification Search
CPC ..... G01R 15/18; G01R 19/0092; G05F 1/613; G05F 1/56; G05F 1/565; G05F 1/569; G05F 1/575; H02M 3/156; H02M 3/1584; H02M 3/157; H02M 3/158; H02M 3/1588; H02M 2003/1566; H02M 2003/1586; H02M 2003/1588; H02M 2001/0009; H02M 2001/0012; H03K 7/08
See application file for complete search history.

(56) References Cited

U.S. PATENT DOCUMENTS

| 5,523,676 | A  | * | 6/1996 | Bach ..................... G01R 19/003 324/103 P |
| 2009/0189580 | A1 | * | 7/2009 | Akahane ................ H02M 3/156 323/282 |
| 2011/0012658 | A1 | * | 1/2011 | Hsieh ....................... H03K 7/08 327/172 |
| 2013/0015830 | A1 | * | 1/2013 | Zhang ...................... H02M 1/14 323/282 |

(Continued)

*Primary Examiner* — Thang Le
(74) *Attorney, Agent, or Firm* — Gardere Wynne Sewell LLP

(57) ABSTRACT

Current flowing through an inductor in response to a pulse width modulation (PWM) control signal is sensed to generate a sensed current. The sensed current is processed over one or more PWM cycles of the PWM control signal to generate an output signal indicative of average inductor current. This processing may include charging and discharging a capacitor at different rates dependent on the sense current, with the detection of capacitor discharge triggering a sampling of a voltage dependent on the sensed current that is indicative of average inductor current. The processing may include using the sensed to current to generate a first charge voltage associated with minimum inductor current and a second charge voltage associated with maximum inductor current, and then averaging the first and second charge voltages to generate an output signal indicative of average inductor current.

19 Claims, 5 Drawing Sheets

(56) References Cited

U.S. PATENT DOCUMENTS

2013/0057239 A1* 3/2013 Kalje .................. H02M 3/1584
                                                323/271
2015/0236586 A1* 8/2015 Babazadeh ............ G01R 31/40
                                                323/272

* cited by examiner

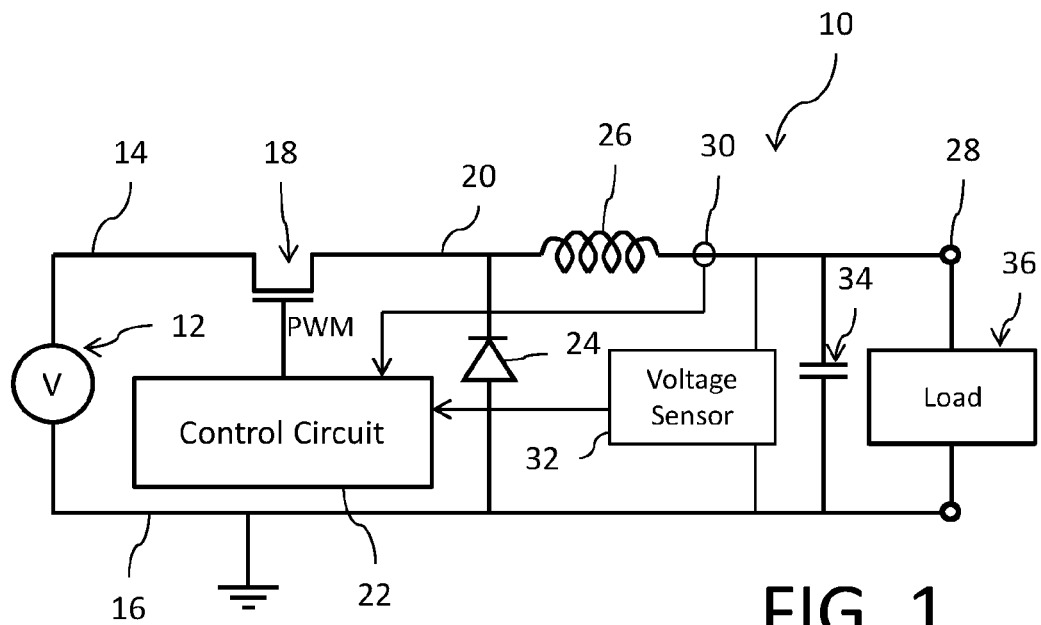
FIG. 1
(Prior Art)
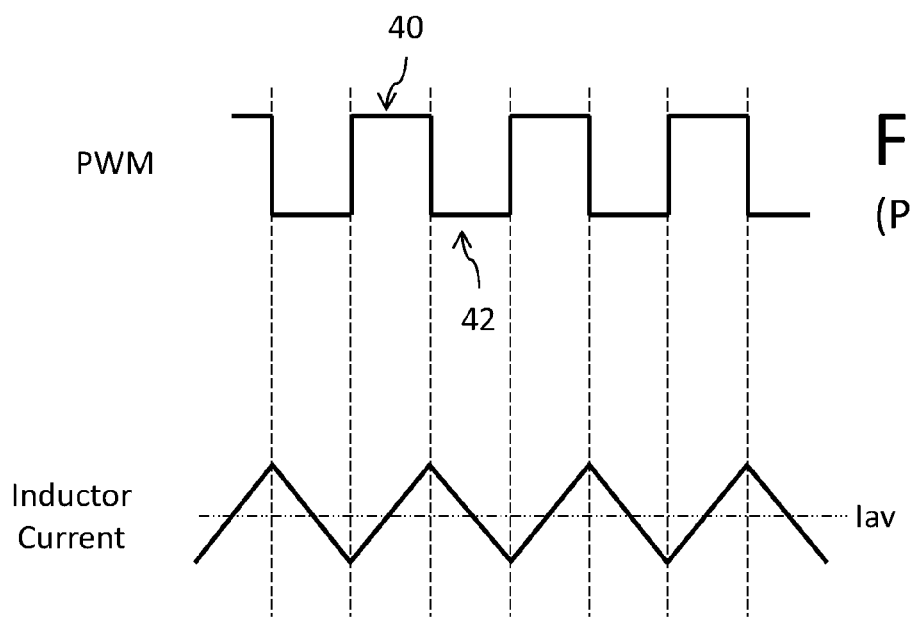
FIG. 2
(Prior Art)
FIG. 3
(Prior Art)

METHOD AND APPARATUS FOR MEASURING AVERAGE INDUCTOR CURRENT DELIVERED TO A LOAD

PRIORITY CLAIM

This application claims priority from Chinese Application for Patent No. 201510818237.5 filed Nov. 23, 2015, the disclosure of which is incorporated by reference.

TECHNICAL FIELD

The present invention relates to current sensing and, in particular, to the measurement of average current delivered to a load by an inductive circuit.

BACKGROUND

Reference is made to FIG. 1 showing a circuit diagram for a basic switching regulator circuit 10. The circuit includes a supply voltage 12 having a first (more positive) node 14 and a second (more negative or ground) node 16. A transistor switch 18 (in this example, an n-channel MOSFET device) has its current conduction path (the source-drain path) coupled between the node 14 and an intermediate node 20. The control terminal (the gate) of the transistor switch 18 receives a pulse width modulated (PWM) control signal generated by a control circuit 22. A diode 24 is connected between the intermediate node 20 and the ground node 16 (with the anode terminal coupled to the node 16 and the cathode terminal coupled to the node 20). It is understood by those skilled in the art that the diode 24 could instead be replaced with a transistor switch (such as an n-channel MOSFET device) that is controlled by an appropriate phase of the PWM control signal if desired. An inductor 26 is coupled between the intermediate node 20 and an output node 28. A current sensing circuit 30 may be used to sense current flowing in the inductor 26, with that sensed current used by the control circuit 22 in generating the PWM signal to regulate the output. A voltage sensing circuit 32 may be used to sense voltage at the output, with that sensed voltage used by the control circuit 22 in generating the PWM signal to regulate the output. A capacitor 34 is coupled between the output node 28 and the node 16 in parallel with a load 36. The PWM signal has a fixed frequency, but a variable duty cycle set by the control circuit 22.

The general configuration of the PWM signal is shown in FIG. 2. During a first phase 40 of a PWM cycle of the PWM signal, the transistor switch 18 is turned on and current flows from the supply voltage 12 through the inductor 26 to charge the capacitor 34. The current through the inductor 26 increases during this phase 40. During a second phase 42 of the PWM cycle, the transistor switch 18 is turned off and the supply voltage 12 is disconnected from the inductor 26. The diode 24 becomes forward biased and the inductor current flows through the load 26. The current through the inductor 26 decreases during this phase 42. The current flow waveform for inductor current is shown in FIG. 3.

In some instances, a measurement of the average current (Iav) flowing through the inductor is an important operational characteristic to know. What is needed in the art is a circuit and method for measuring average inductor current.

SUMMARY

In an embodiment, a circuit comprises: a current sensing circuit configured to generate a sense current corresponding to inductor current flowing through an inductor in response to a pulse width modulation (PWM) control signal; and an averaging circuit operating over one or more PWM cycles of the PWM control signal to process the sense current in phases of one or more PWM cycles to generate an output signal indicative of average current flowing through the inductor.

The averaging circuit comprises: a resistor through which said sense current flows to generate a voltage corresponding to inductor current; and a sample and hold circuit triggered to sample an average voltage generated in response to said voltage corresponding to inductor current and generate said output signal indicative of average current flowing through the inductor.

In one implementation for averaging, the averaging circuit comprises: a first capacitor charged by said sense current to generate a first charge voltage associated with minimum inductor current; a second capacitor charged by said sense current to generate a second charge voltage associated with maximum inductor current; and a charge sharing circuit configured to selectively share charge between the first and second capacitors and output said average voltage.

In another implementation for averaging, the averaging circuit comprises: a capacitor charged by said sense current during a phase of a first PWM cycle to generate charge voltage, said capacitor discharged by a current having a magnitude which is an integer multiple of a magnitude of the sense current during a phase of a second PWM cycle to generate a discharge voltage; and a comparison circuit configured to compare the discharge voltage to a reference voltage and generate a trigger signal for triggering the sample and hold circuit in response to said comparison.

In an embodiment, a method comprises: sensing current corresponding to inductor current flowing through an inductor in response to a pulse width modulation (PWM) control signal; and processing the sensed current over one or more PWM cycles of the PWM control signal to generate an output signal indicative of average current flowing through the inductor.

In one implementation, processing comprises: charging a capacitor with said sensed current during a phase of a first PWM cycle; discharging said capacitor with a discharge current that is an integer multiple of the sensed current during a phase of a second PWM cycle; applying said sensed current across a resistor to generate a voltage; detecting discharge of said capacitor; and sampling said voltage in response to the detected discharge.

In another implementation, processing comprises: applying said sensed current across a resistor to generate a voltage; storing said voltage as a first charge voltage in response to a first phase of a PWM cycle associated with minimum inductor current; storing said voltage as a second charge voltage in response to a second phase of the PWM cycle associated with maximum inductor current; averaging the first and second charge voltages to generate an average voltage in a subsequent PWM cycle; and sampling said average voltage.

BRIEF DESCRIPTION OF THE DRAWINGS

For a better understanding of the embodiments, reference will now be made by way of example only to the accompanying figures in which:

FIG. 1 is a circuit diagram for a basic switching regulator circuit;

FIG. 2 shows the PWM control signal waveform used in the circuit of FIG. 1;

FIG. 3 shows the inductor current waveform for operation of the circuit of FIG. 1;

DETAILED DESCRIPTION OF THE DRAWINGS

Figure 4:
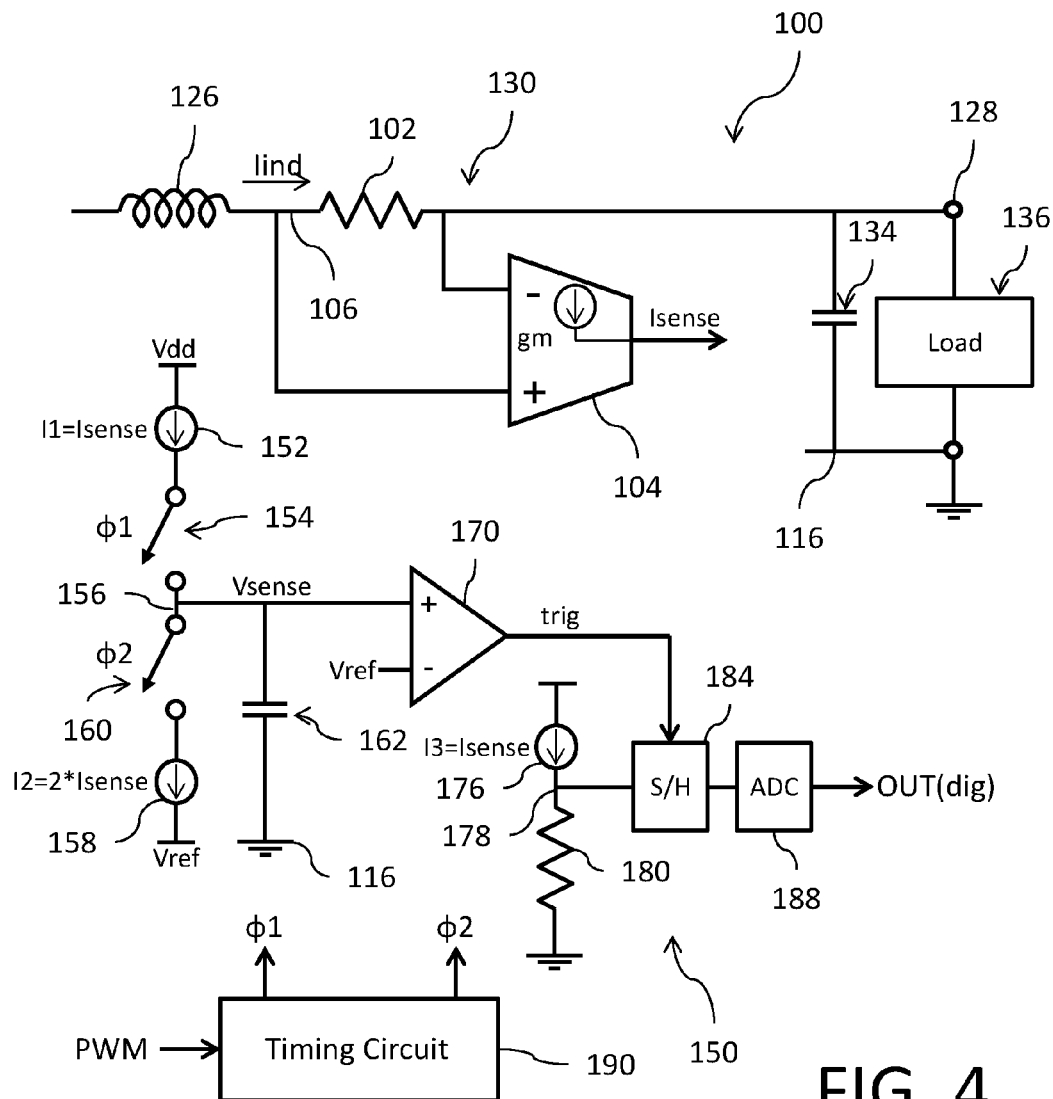
FIG. 4 is a circuit diagram for an embodiment of a circuit for sensing average inductor current.

Reference is now made to FIG. 4 showing a circuit diagram for an embodiment of a circuit 100 for sensing average inductor current. An inductor current Iind flows through an inductor 126 in response to a PWM control signal. Such a current may, for example, be generated by the converter circuit 10 as shown in FIG. 1, or using any other circuit which includes an inductive element through which a variable inductor current flows during circuit operation.

The circuit 100 includes a current sensing circuit 130 configured to sense the inductor current Iind and output a current Isense indicative of the inductor current Iind. The current sensing circuit 130 includes a sense resistor 102 coupled between one terminal of the inductor 126 and an output node 128. The resistor 102 has a resistance value of Rsense. The current sensing circuit 130 further includes a transconductance amplifier 104 having a non-inverting input coupled to node 106 between the inductor 126 and sense resistor 102 and further having an inverting input coupled to the output node 128. The transconductance amplifier 104 senses the voltage drop across the sense resistor 102 and converts that sensed voltage drop to an output current Isense in accordance with the following equation:

$$Isense = gm*(V+-V-) = gm*Iind*Rsense,$$

Wherein: "gm" is the transconductance value of the amplifier 104.

A capacitor 134 is coupled between the output node 128 and a ground node 116 in parallel with a load 136.

The circuit 100 further includes a circuit 150 responsive to the output current Isense and the PWM signal and configured to generate an output signal indicative of an average current flowing through the inductor 126. The circuit 150 includes a first current source 152 coupled between a supply voltage Vdd and a first terminal of a switch circuit 154. The switch circuit 154 may, for example, comprise a transistor switch such as an n-channel MOSFET device. A second terminal of the switch circuit 154 is coupled to node 156. The circuit 150 further includes a second current source 158 coupled between a reference voltage Vref and a first terminal of a switch circuit 160. The switch circuit 160 may, for example, comprise a transistor switch such as an n-channel MOSFET device. A second terminal of the switch circuit 160 is coupled to node 156. A sense capacitor 162 is coupled between the node 156 and the ground node 116. The first current source 152 is configured to generate a first current I1 which is equal to the output current Isense. The second current source 158 is configured to generate a second current I2 which is equal to the twice the output current Isense (i.e., 2*Isense). These current generations may be accomplished, for example, using conventional current mirror circuitry known in the art. The reference voltage Vref is less than the supply voltage Vdd but greater than the ground voltage at the ground node 116.

The circuit 150 further includes a comparator 170 having a non-inverting input coupled to the node 156 and an inverting input coupled to receive the reference voltage Vref. The comparator 170 functions to compare the voltage at node 156 (as stored by the sense capacitor 162) to the reference voltage and generate a trigger signal (trig) in response to that comparison.

The circuit 150 still further includes a third current source 176 coupled between a supply voltage Vdd and an intermediate node 178. A resistor 180 is coupled between the intermediate node 178 and the ground node 116. A sample and hold (S/H) circuit 184 has an input coupled to the intermediate node 178. The S/H circuit 184 functions to sample the voltage at the input (i.e., the voltage at the intermediate node 178) in response to the trigger signal (trig) and output that sampled voltage. An analog-to-digital converter (ADC) circuit 188 has an input coupled to the output of the S/H circuit 184 and a digital signal output. The ADC circuit 188 functions to convert the sampled and held voltage at the output of the S/H circuit 184 to a multi-bit digital output signal OUT(dig) which is representative of the average current flowing through the inductor 126.

A timing circuit 190, for example implemented as a digital logic circuit, receives the PWM control signal and generates the clock signals φ1 and φ2 which control actuation of the switch circuits 154 and 160, respectively.

Figure 5:
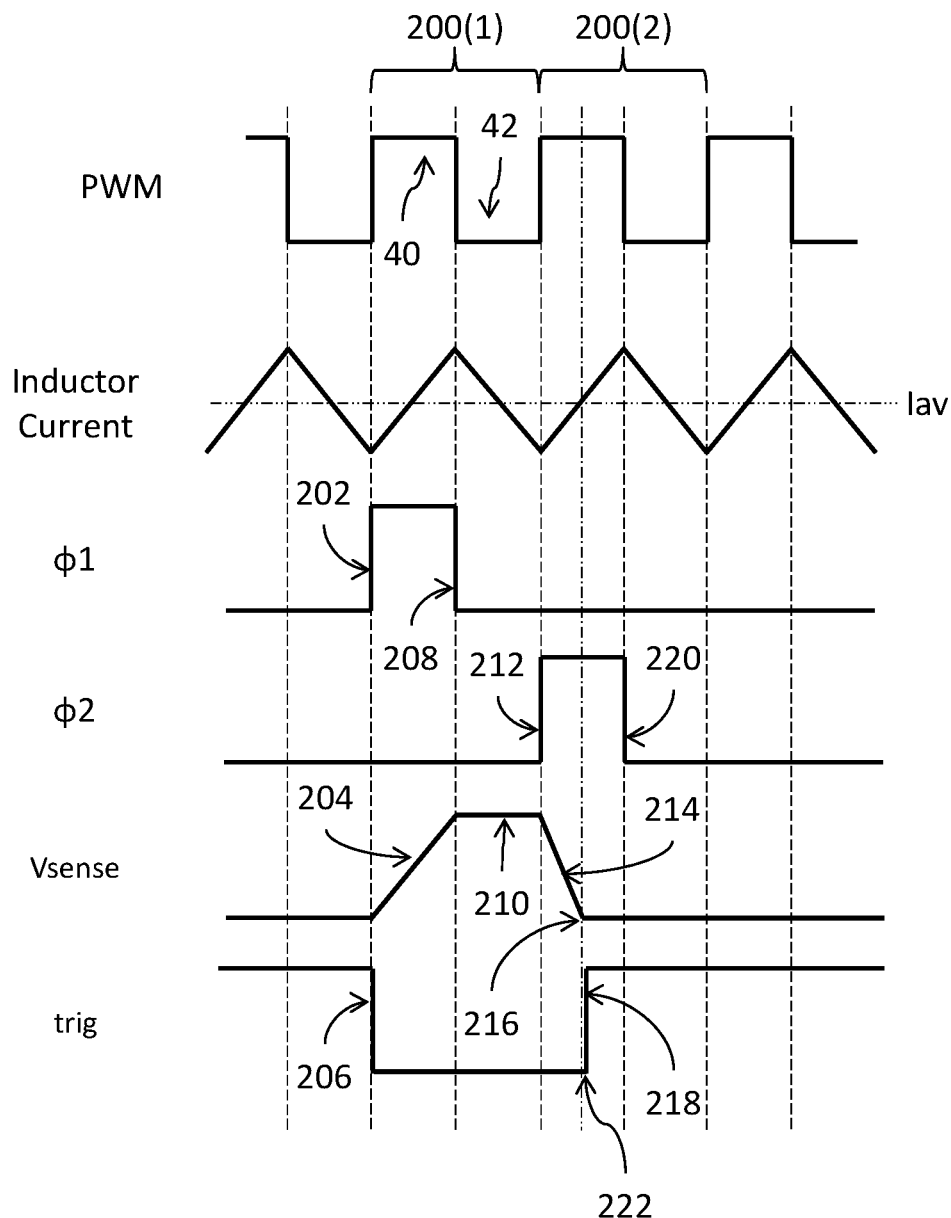
FIG. 5 illustrates operational waveforms for the circuit of FIG. 4.

Reference is now additionally made to FIG. 5 which illustrates operational waveforms for the circuit 150. The circuit 150 operates in accordance with a middle-point measurement technique. The current in the inductor 126 has a minimum value and a maximum value. The desired average current is midway between the minimum and maximum values. The minimum current value occurs at the beginning/end of each cycle 200 of the PWM control signal. The maximum current value occurs at the end of the first phase 40 of the PWM cycle. The minimum current value then occurs at the end of the second phase 42 of the PWM cycle.

The timing circuit 190 generates the clock signals φ1 and φ2 from the PWM control signal. In response to start of the first phase 40 in a first PWM cycle 200(1), the timing circuit 190 asserts the clock signal φ1 (reference 202) and turns on switch 154. The first current source 152 then charges 204 the sense capacitor 162 starting from the reference voltage Vref. When the voltage on capacitor 162 rises above the reference voltage Vref, the comparator 170 changes state and the trigger signal (trig) transitions to logic low (reference 206). Charging of the sense capacitor 162 ends at the end of the first phase 40 and the timing circuit 190 deasserts the clock signal φ1 (reference 208) and turns off switch 154. The voltage on the sense capacitor 162 is held 210 during the second phase 42 of the first PWM cycle 200(1). In response to the start of the first phase 40 in a second PWM cycle 200(2), for example, immediately following the first PWM cycle 200(1), the timing circuit 190 asserts the clock signal φ2 (reference 212) and turns on switch 160. The second current source 158 then discharges 214 the sense capacitor 162. However, because the discharge current I2 is twice the value of the charge current I1 (I2=2*I1), the rate of discharge will be twice the rate of charge. The voltage on the sense capacitor 162 will accordingly return 216 to the reference voltage Vref at substantially the mid-point between minimum current and maximum current (i.e., at the average current value). When the voltage on the sense capacitor 162 falls to the reference voltage Vref, the comparator 170 changes state and the trigger signal (trig) transitions to logic high (reference 218). Thus, the logic high assertion of the trigger signal is substantially coincident with the point in time when average inductor current is flowing. The assertion high of the trigger signal (i.e., the rising edge) causes the S/H circuit 184 to sample the voltage at the intermediate node 178. That sampled voltage at node 178 is indicative of the average inductor current in accordance with the equation:

$$V(178)=Isense*R(180);$$

wherein, at the time of sampling, Isense=Iav. The sampled voltage is converted to a digital value (output signal OUT (dig)) by the ADC circuit 188 which is representative of the average current flowing through the inductor 126. The actual average current value is calculated by dividing the digital value of the sampled voltage by the resistance of resistor 180. The timing circuit 190 deasserts the clock signal φ2 (reference 220) at the end of the first phase 40 in the second PWM cycle 200(2) and turns off switch 160.

The process for determining the average inductor current may be started again in the next PWM cycle 200. Alternatively, a delay of one or more PWM cycles 200 may be imposed before the starting the process again.

The average current determination is substantially accurate. However, there is a slight offset error introduced by the delay in generating the logic high assertion of the trigger signal by the comparator 170 as shown at reference 222.

Figure 6:
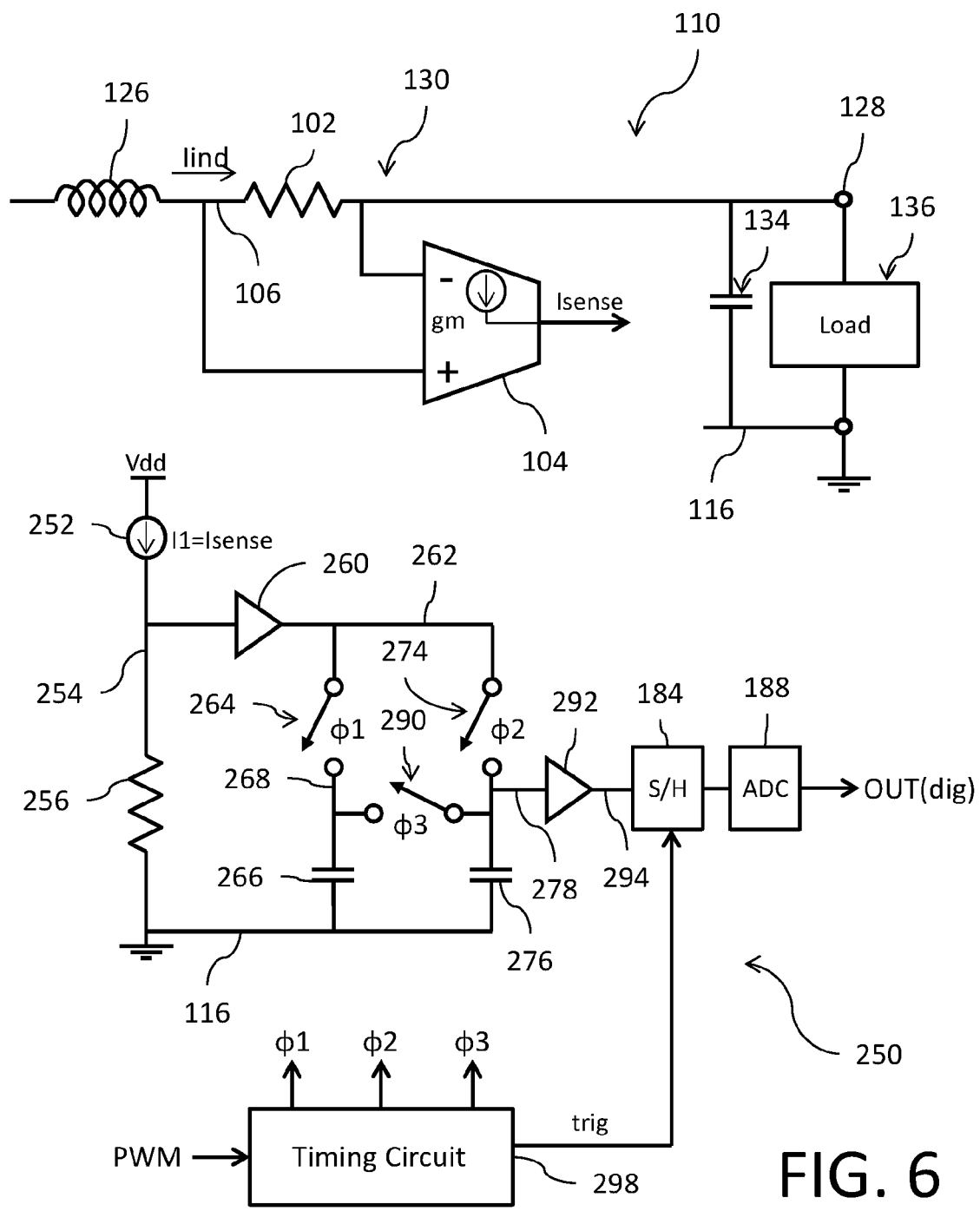
FIG. 6 is a circuit diagram for an embodiment of a circuit for sensing average inductor current.

Reference is now made to FIG. 6 showing a circuit diagram for an embodiment of a circuit 110 for sensing average inductor current. An inductor current Iind flows through an inductor 126 in response to a PWM control signal. Such a current may, for example, be generated by the converter circuit 10 as shown in FIG. 1, or using any other circuit which includes an inductive element through which a variable current flows during circuit operation.

The circuit 102 includes a current sensing circuit 130 configured to sense the inductor current Iind and output a current Isense indicative of the inductor current Iind. The current sensing circuit 130 includes a sense resistor 102 coupled between one terminal of the inductor 126 and an output node 128. The resistor 102 has a resistance value of Rsense. The current sensing circuit 130 further includes a transconductance amplifier 104 having a non-inverting input coupled to node 106 between the inductor 126 and sense resistor 102 and further having an inverting input coupled to the output node 128. The transconductance amplifier 104 senses the voltage drop across the sense resistor 102 and converts that sensed voltage drop to an output current Isense in accordance with the following equation:

$$Isense=gm*(V+-V-)=gm*Iind*Rsense,$$

wherein: "gm" is the transconductance value of the amplifier 104.

A capacitor 134 is coupled between the output node 128 and a ground node 116 in parallel with a load 136.

The circuit 102 further includes a circuit 250 responsive to the output current Isense and the PWM signal and configured to generate an output signal indicative of an average current flowing through the inductor 126. The circuit 250 includes a first current source 252 coupled between a supply voltage Vdd and a first intermediate node 254. A resistor 256 is coupled between the intermediate node 254 and the ground node 116. The first current source 252 is configured to generate a first current I1 which is equal to the output current Isense. This may be accomplished, for example, using conventional current mirror circuitry known in the art. The voltage at node 252 tracks the current I1 (Isense) according to the equation:

$$V(254)=Isense*R(256).$$

A unity gain buffer 260 has an input coupled to the intermediate node 254 and an output coupled to a second intermediate node 262. A first switch circuit 264 is coupled in series with a first capacitor 266 between the intermediate node 262 and the ground node 116. The switch circuit 264 may, for example, comprise a transistor switch such as an n-channel MOSFET device. A first terminal of the switch 264 is connected to the intermediate node 262 and a second terminal of the switch is connected to third intermediate node 268. A first plate of capacitor 266 is connected to intermediate node 268 and a second plate of the capacitor is connected to the ground node 116. A second switch circuit 274 is coupled in series with a second capacitor 276 between the intermediate node 262 and the ground node 116. The switch circuit 274 may, for example, comprise a transistor switch such as an n-channel MOSFET device. A first terminal of the switch 274 is connected to the intermediate node 262 and a second terminal of the switch is connected to fourth intermediate node 278. A first plate of capacitor 276 is connected to intermediate node 278 and a second plate of the capacitor is connected to the ground node 116. A third switch circuit 290 is coupled between the intermediate node 268 and the intermediate node 278. The switch circuit 290 may, for example, comprise a transistor switch such as an n-channel MOSFET device.

A second unity gain buffer 292 has an input coupled to the intermediate node 278 and an output 294. A sample and hold (S/H) circuit 184 has an input coupled to the output 294. The S/H circuit 184 functions to sample the voltage at its input (i.e., the voltage at the output 294) in response to a trigger signal (trig) and output that sampled voltage. An analog-to-digital converter (ADC) circuit 188 has an input coupled to the output of the S/H circuit 184 and a digital signal output. The ADC circuit 188 functions to convert the sampled and held voltage at the output of the S/H circuit 184 to a multi-bit digital output signal OUT(dig) which is representative of the average current flowing through the inductor 126.

A timing circuit 298, for example implemented as a digital logic circuit, receives the PWM control signal and generates the clock signals φ1, φ2 and φ3 which control actuation of the switch circuits 264, 274 and 290, respectively. The timing circuit 298 further generates the trigger signal.

Figure 7:
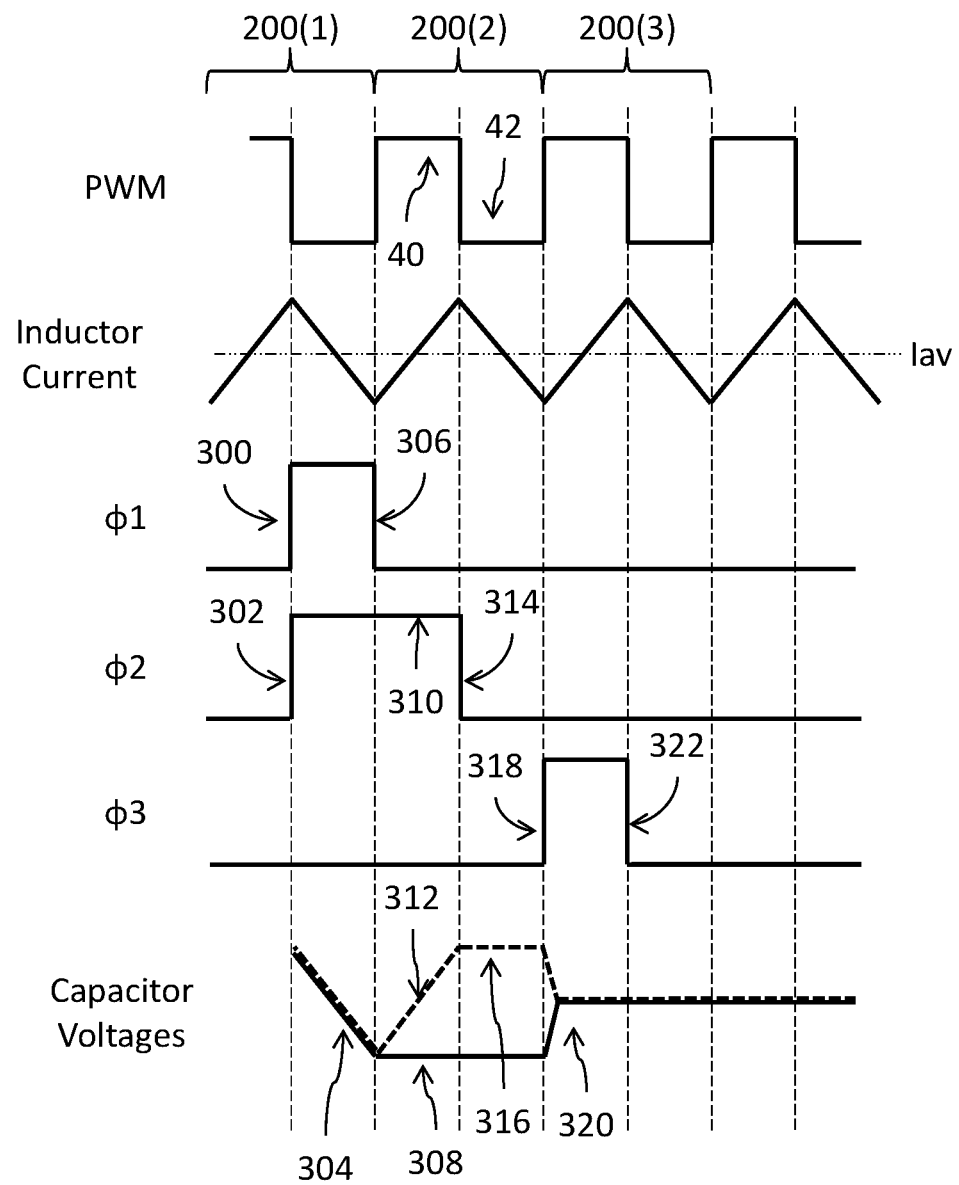
FIG. 7 illustrates operational waveforms for the circuit of FIG. 6.

Reference is now additionally made to FIG. 7 which illustrates operational waveforms for the circuit 250. The circuit 250 operates in accordance with a peak-point measurement technique. The current in the inductor 126 has a minimum value at a minimum peak point and a maximum value at a maximum peak point determined by the PWM signal. The desired average current is midway between the minimum and maximum peak points. Voltages corresponding to each of the minimum and maximum peak points are detected and then averaged, with the resulting average voltage corresponding to the average inductor current.

The timing circuit 298 generates the clock signals φ1, φ2 and φ3 from the PWM control signal. In response to the second phase 42 in a first PWM cycle 200(1), the timing circuit 298 asserts the clock signals φ1 (reference 300) and φ2 (reference 302) and turns on the switches 264 and 274. The current source 252 applies the current I1=Isense across the resistor 256 to develop a voltage at the intermediate node 254. The voltage is buffered and applied to capacitors 266 and 276. Because the current I1 is decreasing during the second phase 42, the voltage at node 254, and thus the voltage across the capacitors 266 and 276, is also decreasing (reference 304). The voltage at capacitor 266 is indicated with a solid line, while the voltage at capacitor 276 is indicated with a dashed line.

At the end of the second phase 42 of the first PWM cycle 200(1), the timing circuit 298 deasserts the clock signal φ1 (reference 306) and turns off the switch 264. The capacitor 266 is now disconnected from nodes 254 and 262 at a point in time corresponding to the minimum peak point of the inductor current. The voltage stored 308 across capacitor 266 is thus indicative of the minimum inductor current.

The timing circuit 298, however, continues to assert the clock signal φ2 (reference 310) and thus switch 274 remains turned on. A first phase 40 of a second PWM cycle 200(2) begins. The current source 252 continues to apply the current I1=Isense across the resistor 256 to develop a voltage at the intermediate node 254. The voltage is buffered and applied to capacitor 276. Because the current I1 is increasing during the first phase 40, the voltage at node 254, and thus the voltage across the capacitor 276, is also increasing (reference 312).

At the end of the first phase 40 of the second PWM cycle 200(2), the timing circuit 298 deasserts the clock signal φ2 (reference 314) and turns off the switch 274. The capacitor 276 is now disconnected from nodes 254 and 262 at a point in time corresponding to the maximum peak point of the inductor current. The voltage stored 316 across capacitor 276 during the second phase 42 is thus indicative of the maximum inductor current.

At any point after the capacitors 266 and 276 have stored voltages indicative of the minimum and maximum peak points, respectively, of the inductor current, the timing circuit 298 asserts the clock signal φ3 (reference 318) and turns on the switch 290. In the illustrated embodiment, this operation is synchronized with the start of the next PWM cycle 200(3), but this is by example only. This action connects the capacitors 266 and 276 in parallel with each other. Charge sharing occurs between those capacitors and the voltage at node 278 moves to a mid-point value between the stored voltage indicative of the minimum peak point (from capacitor 266) and the stored voltage indicative of the maximum peak point (from capacitor 276). This is shown at reference 320. The mid-point voltage at node 278 is thus indicative of the average inductor current. This voltage is buffered by the unity gain buffer 292 and presented at output 294.

The timing circuit 298 further asserts a trigger signal (trig) causing the S/H circuit 184 to sample the voltage at the output 294. This trigger signal generation occurs after the voltage at node 278 has settled following actuation of switch 290. The sampled voltage at output 294 is converted to a digital value (output signal OUT(dig)) by the ADC circuit 188 which is representative of the average current flowing through the inductor 126. The actual average current value is calculated by dividing digital value of the sampled voltage by the resistance of resistor 256. The timing circuit 298 deasserts the clock signal φ3 (reference 322) at the end of the first phase 40 in the third PWM cycle 200(3) and turns off switch 290.

The process for determining the average inductor current may be started again in the next PWM cycle 200. Alternatively, a delay of one or more PWM cycles 200 may be imposed before the starting the process again.

The foregoing description has been provided by way of exemplary and non-limiting examples of a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
 a current sensing circuit configured to generate a sense current corresponding to an inductor current flowing through an inductor in response to a pulse width modulation (PWM) control signal, wherein the inductor current has a maximum current associated with a one phase of one or more of the PWM cycles and a minimum current associated with another phase of one or more of the PWM cycles; and
 an averaging circuit operating over one or more PWM cycles of the PWM control signal to process the sense current during one phase of one or more of the PWM cycles to obtain a first value and processing the sense current during another phase of one or more of the PWM cycles to obtain a second value, said averaging circuit comprising:
 a capacitor charged by said sense current during said one phase, said first value comprising a charge voltage, said capacitor discharged by a current having a magnitude which is an integer multiple of a magnitude of the sense current during said another phase, said second value comprising a discharge voltage;
 a resistor through which said sense current flows to generate a sense voltage;
 a sample and hold circuit triggered in response to said discharge voltage to sample said sense voltage and to generate an output signal indicative of average current flowing through the inductor.

2. The circuit of claim 1, wherein the integer multiple is 2.

3. The circuit of claim 1, wherein said averaging circuit further comprises a comparison circuit configured to compare the discharge voltage to a reference voltage and generate a trigger signal for triggering the sample and hold circuit in response to said comparison.

4. The circuit of claim 1, wherein each PWM cycle includes a first phase and a second phase, and wherein said one phase is the first phase of a first PWM cycle and wherein said another phase is the first phase of a second PWM cycle different from the first PWM cycle.

5. The circuit of claim 1, further comprising an analog-to-digital converter circuit configured to convert the output signal indicative of average current flowing through the inductor to a digital output.

6. A circuit comprising:
 a current sensing circuit configured to generate a sense current corresponding to an inductor current flowing through an inductor in response to a pulse width modulation (PWM) control signal, wherein the inductor current has a maximum current associated with a one phase of one or more of the PWM cycles and a minimum current associated with another phase of one or more of the PWM cycles; and
 an averaging circuit operating over one or more PWM cycles of the PWM control signal to process the sense current during one phase of one or more PWM cycles of the PWM control signal to obtain a first value and processing the sense current during another phase of one or more PWM cycles of the PWM control signal to obtain a second value;
wherein said averaging circuit comprises:
a first capacitor charged by said sense current during said one phase, said first value comprising a first charge voltage;
a second capacitor charged by said sense current during said another phase, said second value comprising a second charge voltage;
a charge sharing circuit configured to selectively share charge between the first and second capacitors; and
a sample and hold circuit triggered by charge sharing to sample a shared voltage of the first and second capacitors and generate an output signal indicative of average current flowing through the inductor.

7. The circuit of claim 6, wherein said averaging circuit further comprises:
a first switch selectively actuated in response to said one phase to charge the first capacitor; and
a second switch selectively actuated in response to said another phase to charge the second capacitor.

8. The circuit of claim 7, wherein said second switch is further selectively actuated in response to said one phase.

9. The circuit of claim 7, wherein said averaging circuit further comprises a third switch selectively actuated to connect the first and second capacitors in parallel for charge sharing.

10. The circuit of claim 6, further comprising an analog-to-digital converter circuit configured to convert the output signal indicative of average current flowing through the inductor to a digital output.

11. A circuit, comprising:
a current sensing circuit configured to generate a sense current corresponding to inductor current flowing through an inductor in response to a pulse width modulation (PWM) control signal; and
an averaging circuit operating over one or more PWM cycles of the PWM control signal to process the sense current in phases of one or more PWM cycles to generate an output signal indicative of average current flowing through the inductor;
wherein said averaging circuit comprises:
a resistor through which said sense current flows to generate a voltage corresponding to the inductor current;
a first capacitor charged by said sense current to generate a first charge voltage associated with minimum inductor current;
a second capacitor charged by said sense current to generate a second charge voltage associated with maximum inductor current;
a charge sharing circuit configured to selectively share charge between the first and second capacitors and output an average voltage; and
a sample and hold circuit triggered to sample the average voltage and generate said output signal indicative of average current flowing through the inductor.

12. The circuit of claim 11, further comprising an analog-to-digital converter circuit configured to convert the output signal indicative of average current flowing through the inductor to a digital output.

13. The circuit of claim 11, further including a buffer circuit coupled between the resistor and the sample and hold circuit to buffer the average voltage.

14. The circuit of claim 11, wherein said averaging circuit further comprises:
a first switch selectively actuated in response to a first phase of a PWM cycle to charge the first capacitor; and
a second switch selectively actuated in response to a second phase of said PWM cycle to charge the second capacitor.

15. The circuit of claim 14, wherein said second switch is further selectively actuated in response to said first phase.

16. The circuit of claim 14, wherein said averaging circuit further comprises a third switch selectively actuated during a subsequent PWM cycle to connect the first and second capacitors in parallel for charge sharing.

17. A circuit, comprising:
a current sensing circuit configured to generate a sense current corresponding to an inductor current flowing through an inductor in response to a pulse width modulation (PWM) control signal; and
an averaging circuit operating over one or more PWM cycles of the PWM control signal to process the sense current in phases of one or more PWM cycles to generate an output signal indicative of average current flowing through the inductor;
wherein said averaging circuit comprises:
a capacitor charged by said sense current during a phase of a first PWM cycle to generate charge voltage, said capacitor discharged by a current having a magnitude which is an integer multiple of a magnitude of the sense current during a phase of a second PWM cycle to generate a discharge voltage;
a comparison circuit configured to compare the discharge voltage to a reference voltage and generate a trigger signal;
a resistor through which said sense current flows to generate a voltage corresponding to the inductor current; and
a sample and hold circuit triggered by said trigger signal to sample an average voltage generated in response to said voltage corresponding to the inductor current and generate said output signal indicative of average current flowing through the inductor.

18. The circuit of claim 17, wherein the integer multiple is 2.

19. A method, comprising:
sensing current corresponding to inductor current flowing through an inductor in response to a pulse width modulation (PWM) control signal; and
processing the sensed current over one or more PWM cycles of the PWM control signal to generate an output signal indicative of average current flowing through the inductor,
wherein the processing comprises:
charging a capacitor with said sensed current during a phase of a first PWM cycle;
discharging said capacitor with a discharge current that is an integer multiple of the sensed current during a phase of a second PWM cycle;
applying said sensed current across a resistor to generate a voltage;
detecting discharge of said capacitor; and
sampling said voltage in response to the detected discharge.

* * * * *